United States Patent [19]
Tada

[11] Patent Number: 6,078,529
[45] Date of Patent: Jun. 20, 2000

[54] DATA STORING DEVICE

[75] Inventor: Yoshihiro Tada, Kyoto, Japan

[73] Assignee: Rohm Co., Ltd., Kyoto, Japan

[21] Appl. No.: 09/235,712

[22] Filed: Jan. 22, 1999

[30] Foreign Application Priority Data

Jan. 22, 1998 [JP] Japan .................................. 10-010792

[51] Int. Cl.[7] .................................................. G11C 7/00
[52] U.S. Cl. ............................... 365/189.07; 365/189.09; 365/207; 365/210
[58] Field of Search .................................. 365/205, 210, 365/145, 149

[56] References Cited

U.S. PATENT DOCUMENTS

| | | | |
|---|---|---|---|
| 5,031,143 | 7/1991 | Jaffe | 365/145 |
| 5,218,566 | 6/1993 | Papaliolios | 365/145 |
| 5,629,888 | 5/1997 | Saito et al. | 365/145 |
| 5,638,318 | 6/1997 | Seyyedy | 365/145 |
| 5,768,176 | 6/1998 | Katoh | 365/145 |
| 5,852,571 | 12/1998 | Kinney | 365/145 |
| 5,912,835 | 6/1999 | Katoh | 365/145 |
| 5,917,746 | 6/1999 | Seyyedy | 365/149 |

Primary Examiner—Viet Q. Nguyen
Attorney, Agent, or Firm—Merchant & Gould P.C.

[57] ABSTRACT

It is an object of the present invention to provide a data storing device capable of increasing the capacity of the storage while restricting undesirable growth in the size of the device. A sensing amplifier SA is used commonly for element blocks CB0 and CB1. In this way, the device can be downsized in a direction of "Y" shown in FIG. 1 in comparison with the case when dedicated sensing amplifiers are provided to each of these blocks respectively. Also, the dummy cell DC00 of the element block CB0 and the dummy cell DC10 of the element block CB1 composes a reference value generating part. That is, the reference value generating part is used commonly for the element block CB0 and the element block CB1. In this way, the device can also be downsized in the direction of "Y" in comparison with the case when dedicated reference value generating parts are provided to each of these blocks respectively. Further, memory cells such as MC01, ... , as well as the dummy cells DC00, and DC01 have the same structure as the memory cell MC00. As a result, not much dead space is produced during the layout of the cells by employing the same arrangement between the memory cells and the dummy cells.

13 Claims, 10 Drawing Sheets

<PRIOR ART>

<PRIOR ART>

<PRIOR ART>

DATA STORING DEVICE

CROSS-REFERENCE TO RELATED APPLICATION

The entire disclosure of Japanese Patent Application No. Hei 10-10792 filed on Jan. 22, 1998 including specification, claims, drawings and summary is incorporated herein by reference in its entirety.

BACKGROUND OF INVENTION

1. Field of the Invention

This invention relates to a data storing device, more specifically to a data storing device capable of storing a large quantity of data.

2. Description of the Related Art

A ferroelectric memory 10 using a ferroelectric capacitor is known as a data storing device. A part of the circuit structure of the conventional ferroelectric memory is depicted in FIG. 9.

In the conventional ferroelectric memory, a plurality of memory cells MC0, MC1, MC2, . . . and a sensing amplifier SA are connected to a pair of the bit lines BL and BLB. A dummy cell DC0 and another dummy cell DC1 are respectively connected to the bit line BLB and the bit line BL.

The memory cell MC0 is a memory element so called one transistor and one capacitor type memory element. That is, the memory cell MC0 includes a ferroelectric capacitor 2, and one end of the ferroelectric capacitor 2 is connected to a bit line BL through a transistor 4. The memory cell MC0 stores data corresponding to a polarization state of the ferroelectric capacitor 2.

FIG. 10A is a graph showing a relationship between a polarization state of the ferroelectric capacitor 2 and the data stored in the memory cell MC0 For example, it is defined that a value of the stored data is in "1" when the polarization state of the ferroelectric capacitor 2 is in P1, and a value of the stored data is in "0" when the polarization state of the ferroelectric capacitor 2 is in P2 in this description.

Other memory cells MC1, MC2, . . . have the same structure as the memory cell MC0.

The dummy cell DC0 includes a ferroelectric capacitor 6, and one end of the ferroelectric capacitor 6 is connected to the bit line BLB through a transistor 8. The ferroelectric capacitor 6 is designed so as to have a larger area than that of the ferroelectric capacitor 2 of the memory cell (see FIG. 10A, FIG. 10B).

The dummy cell DC1 has the same structure as the dummy cell DC0.

Although, the FIG. 9 does not completely depicts its structure, the ferroelectric memory 10 has a plurality of elements 12 (hereinafter referred to as column element) 12 which has the structure described earlier in the direction of "X".

For example, in order to read out the data stored in the memory cell MC0, it is necessary to apply a voltage representing "HIGH" state to a line EQ, and then precharging the bit line BLB and the bit line BL with the ground voltage G.

Thereafter, the memory cell MC0 is selected by applying a voltage representing a "HIGH" state to the word line WL0, while selecting the dummy cell DC0 by applying a voltage representing the "HIGH" state to a word line DWL0 for dummy cells (hereinafter referred to as dummy word line). The sensing amplifier SA detects a voltage appearing on the bit lines BL and BLB by applying a readout voltage having a predetermined value to a plate line PL and a plate line DPL for dummy cells (hereinafter referred to as dummy plate line) under the condition described above.

An electric charge $\Delta Q1$ is discharged from the ferroelectric capacitor 2 when the data "1" is stored in the memory cell MC0, and another electric charge $\Delta Q0$ is discharged from the ferroelectric capacitor 2 when the data "0" is stored in the memory cell MC0 as shown in FIG. 10A. In this way, a voltage corresponding to the electric charge discharged from the ferroelectric capacitor 2 appears on the bit line BL.

On the other hand, an electric charge $\Delta Qs$ is discharged from the ferroelectric capacitor 6 of the dummy cell DC0 as shown in FIG. 10B. Thus, a voltage corresponding to the electric charge $\Delta Qs$ discharged from the ferroelectric capacitor 6 appears on the bit line BLB. The value of the electric charge $\Delta Qs$ is set so as to be greater than that of the electric charge $\Delta Q0$ as well as to be less than that of the electric charge $\Delta Q1$.

The sensing amplifier SA determines whether the data stored in the memory cell MC0 is either in "1" or "0" by comparing whether or not the voltage appearing on the bit line BL is greater than the voltage (the reference voltage) appearing on the bit line BLB. The data stored in the memory cell MC0 can be read out by carrying out such detection.

However, the prior art ferroelectric memory described earlier has the following problems to be resolved. In order to increase the storing capacity of the ferroelectric memory 10, it is necessary to dispose other column elements 12 in the direction "X" shown in FIG. 9, while increasing the number of memory cells included in a column element 12 in the direction of "Y".

The length of the bit lines BL and BLB becomes longer than they should be when too many memory cells such as the memory cells MC0, MC1, MC2, . . . are included in the column element 12. Under the circumstances, the value of a signal voltage which appears on the bit lines BL and BLB may be decreased and/or operating speed of the ferroelectric memory could be decreased in the readout operation.

In order to resolve the problems, a ferroelectric memory (not shown) having a structure so as to dispose another ferroelectric memory 10 symmetrically with respect to an axis a shown in FIG. 9 is proposed. By employing the structure, the number of the memory cells in the direction of "Y" can be doubled without increasing the number of memory cells MC0, MC1, MC2, . . . connected to the one column element 12. In other words, the number of memory cells in the direction of "Y" can be doubled without decreasing the value of the signal voltage and/or operating speed of the ferroelectric memory.

However, the size of the data storing device may undesirably be increased substantially proportional to the number of the memory cells when just another ferroelectric memory 10 is disposed symmetrically to the prior art ferroelectric memory 10 with respect to an axis $\alpha$.

SUMMARY OF THE INVENTION

It is an object of the present invention to overcome the above mentioned drawbacks on the data storing device associated with the prior arts, and to provide a data storing device capable of increasing the capacity of the storage while restricting undesirable growth in the size of the device.

In accordance with characteristics of the present invention, there is provided a data storing device comprising:

memory element for storing data, a reference value generating part for generating a reference value, and a judging part for judging contents of the data stored in the memory elements by comparing a data corresponding value corresponding to the data stored in the memory elements with the reference value generated by the reference value generating part, wherein the data storing device includes a first element block having one or more of the memory elements and a second element block having one or more of the memory elements not belong to the first element block, and wherein the reference value generating part includes a first reference element belonging to the first element block and a second reference element belonging to the second element block, and wherein the reference value generating part generates the reference value by synthesizing a first reference value established by the first reference element and a second reference value generated by the second reference element, and wherein the judging part judges the contents of data stored in a selected memory element by comparing a data corresponding value corresponding to the data stored in the selected memory element which is one of the memory elements belonging to the first element block and the memory element belonging to the second element block with the reference value.

In accordance with characteristics of the present invention, there is provided a data storing device comprising:

two element blocks, each of which includes a pair of data lines isolated from each other, one or more memory elements, one of which is capable of being selectively connected to one data line, and a references element connected to the other data line, and a sensing amplifier having a pair of detection terminals, for receiving signals having incoming values the sensing amplifier judging which one of the incoming values being inputted to the detection terminals is greater, and a pair of signals having output values different from each other being outputted from the detection terminals by the sensing amplifier in accordance with the judgement made thereby, wherein the sensing amplifier judges contents of data stored in a selected memory element using a reference value generated with the pair of reference elements by connecting one detection terminal of the sensing amplifier with the one data line belonging to one of the element blocks including the selected memory element while connecting the other detection terminal of the sensing amplifier with the other data line, both of the data lines belonging respectively to the element blocks.

While the novel features of the invention are set forth in a general fashion, both as to organization and content, the invention will be better understood and appreciated, along with other objects and features thereof from the following detailed description taken in conjunction with the drawings.

DETAILED DESCRIPTION OF THE PREFERRED EMBODIMENT

Figure 1:
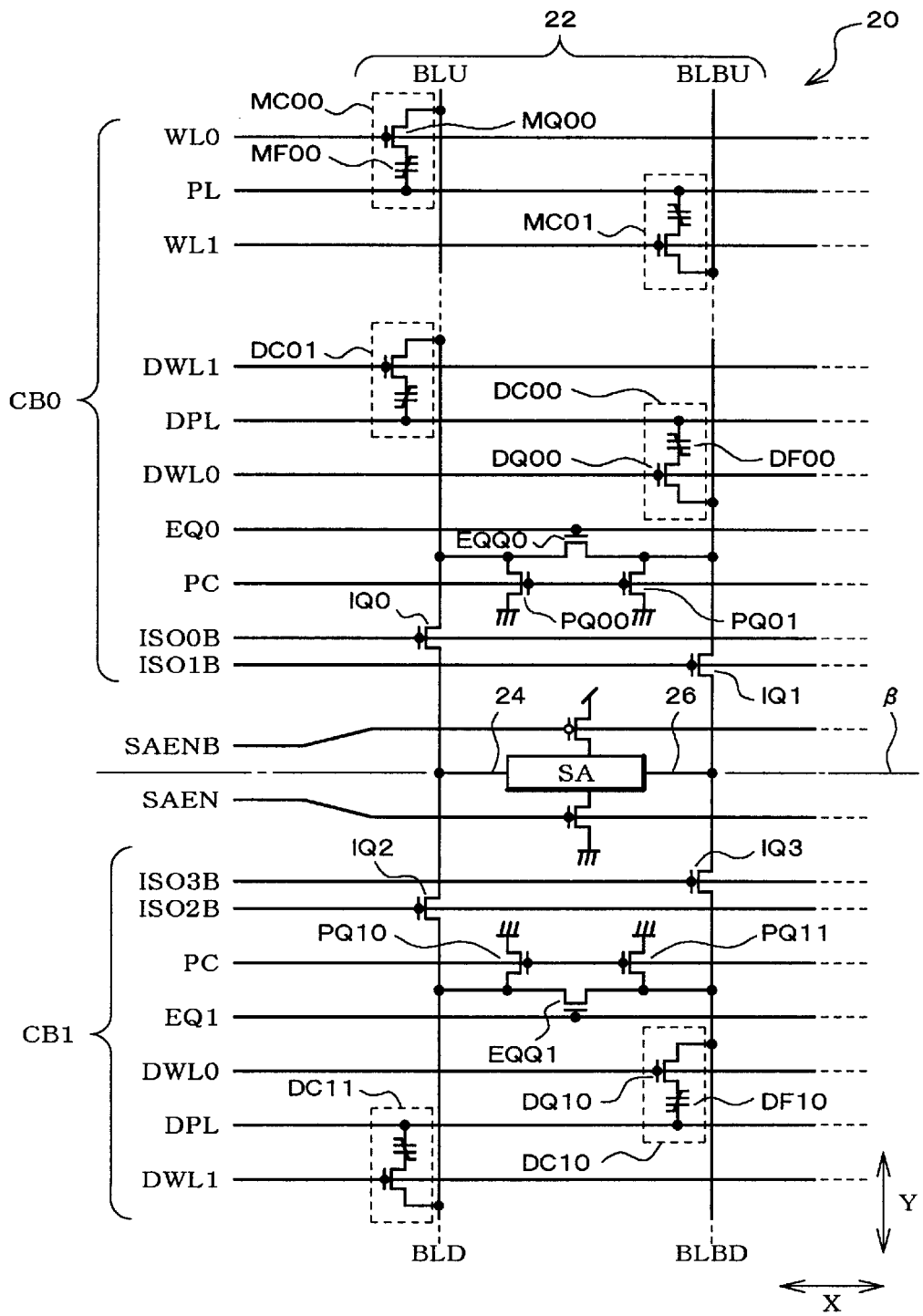
FIG. 1 is a circuit diagram showing a part of a ferroelectric memory 20 as an example of a data storing device according to the present invention.

FIG. 1 is a circuit diagram showing a part of a ferroelectric memory 20 as an example of a data storing device according to the present invention. The ferroelectric memory 20 has a structure including a plurality of memory cells in a matrix format, each of the memory cells is a so called one transistor and one capacitor type memory cell. Although, a plurality of column elements are disposed in the direction of "X" shown in FIG. 1 in the practical device, only one column element 22 is depicted for clarity of the description.

The column element 22 includes a pair of element blocks CB0 and CB1, and a sensing amplifier SA forming a judging part.

At first, the structure of the element block CB0 forming a first element block will be described. The element block CB0 comprises a pair of upper bit lines BLU, BLBU forming a pair of data lines, memory cells MC00, MC01, which form a plurality of memory elements, and dummy cells DC00, DC01 forming a reference element.

The memory cell MC00 includes a ferroelectric capacitor MF00 and a transistor MQ00. One end of the ferroelectric capacitor MF00 is connected to the upper bit lines BLU through the transistor MQ00. The gate of the transistor MQ00 is connected to a word line WL0. The other end of the ferroelectric capacitor MF00 is connected to a plate line PL.

Figure 3:
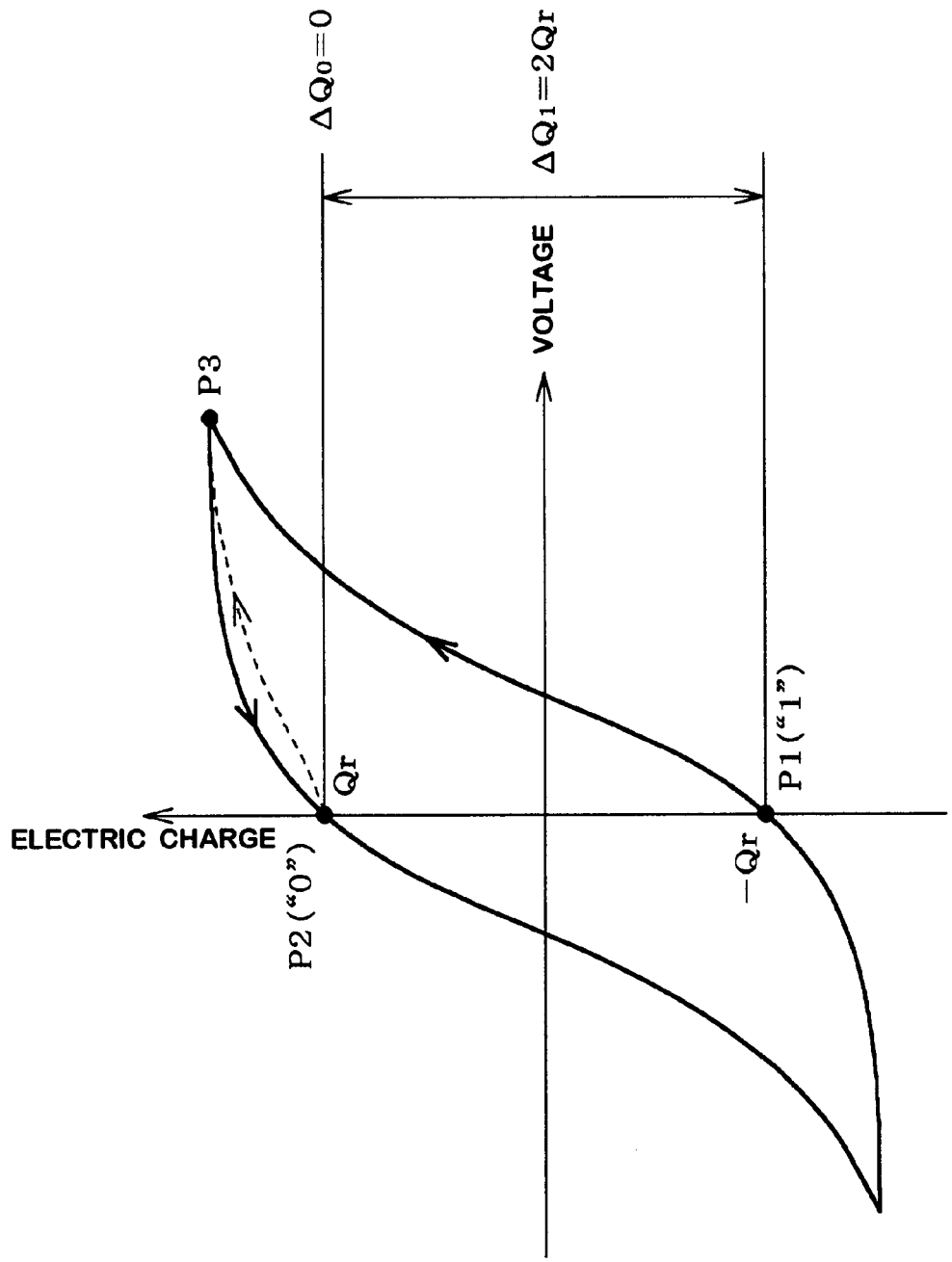
FIG. 3 is a graph showing voltage/charge characteristics of a ferroelectric capacitor MF00.

The memory cell MC00 stores data corresponding to the polarization state of the ferroelectric capacitor MF00. FIG. 3 is a graph showing voltage/charge characteristics of the ferroelectric capacitors MF00, . . . composing the memory cells MC00, . . . , and that of ferroelectric capacitors DF00, . . . which compose the dummy cells DC00, . . . . The data stored in the memory cell MC00 is defined as "1" when the polarization state of the ferroelectric capacitor MF00 is in a point P1 shown in FIG. 3, and that is defined as "0" when the polarization state of the ferroelectric capacitor MF00 is in a point P2.

Other memory cells such as MC01, , as well as the dummy cells DC00, and DC01 have the same structure as the memory cell MC00. In other words, each of the cells comprises the ferroelectric capacitor and the transistor having the identical arrangement. And each of the ferroelectric capacitors has the same hysteresis loop (voltage/charge characteristics). As a result, not much dead space is produced during the layout of the cells by employing the identical arrangement between the memory cells and the dummy cells.

A pair of the upper bit lines BLU, BLBU are designed so as to be respectively grounded through transistors PQ00, PQ01, and connecting to each other through a transistor EQQ0.

One of the upper bit lines BLU is connected to one end of a detection terminal 24 of the sensing amplifier SA through a transistor IQ0, the other upper bit line BLBU is designed so as to connect with the other detection terminal 26 of the sensing amplifier SA through a transistor IQ1.

The element block CB1 forming a second element block has a similar structure as the element block CB0. In other words, the element block CB1 is disposed symmetrically to the element block CB0 with respect to an axis β. Therefore, the sensing amplifier SA is used commonly for the element block CB0 and the element block CB1. In this way, the device can be downsized in a direction of "Y" shown in FIG. 1 in comparison with the case when dedicated sensing amplifiers are provided to these blocks respectively.

For example, the element block CB0 and the element block CB1 correspond respectively to an element block including a selected memory element, and an element block not including a selected memory element when access to the memory cell MC00 is made, that is, the memory cell MC00 is in the selected memory element.

Also, the upper bit lines BLU, BLBU correspond respectively to one data line belonging to an element block including a selected memory element, and the other data line belonging to an element block including a selected memory element.

The lower bit lines BLD, BLBD shown in FIG. 1 included in the element block CB1 correspond respectively to one data line belonging to an element block not including a selected memory element, and the other data line belonging to an element block not including a selected memory element.

Further, the dummy cell DC00 forming the first reference element corresponds to a reference element belonging to an element block including a selected memory element, and a dummy cell DC10 forming a second reference element corresponds to a reference element belonging to an element block not including a selected memory element. That is, the dummy cell DC00 of the element block CB0 and the dummy cell DC10 of the element block CB1 compose a reference value generating part. In other words, the reference value generating part is used commonly for the element block CB0 and the element block CB1. In this way, the device can also be downsized in the direction of "Y" in comparison with the case when dedicated reference value generating parts are provided to these blocks respectively.

The dummy cells DC00, DC10 are designed so as to maintain the opposite polarization state shown in the points P1 and P2 from each other out of the polarization states (see FIG. 3), as will be described later.

For easy reference, the upper bit lines BLBU, BLU shown in FIG. 1 correspond respectively to one data line belonging to an element block including a selected memory element, and the other data line belonging to an element block including a selected memory element when access to the memory cell MC01 is made, that is, the memory cell MC01 is in the selected memory element.

At that time, the lower bit lines BLBD, BLD in the element block CB1 correspond respectively to one data line belonging to an element block not including a selected memory element, and the other data line belonging to an element block not including a selected memory element.

Further, the dummy cell DC01 forming a first reference element corresponds to a reference element belonging to an element block including a selected memory element, and a dummy cell DC11 forming the second reference element corresponds to a reference element belonging to an element block not including a selected memory element. That is, the dummy cell DC01 of the element block CB0 and the dummy cell DC11 of the element block CB1 compose the reference value generating part when access to the memory cell MC01 is made.

Figure 2:
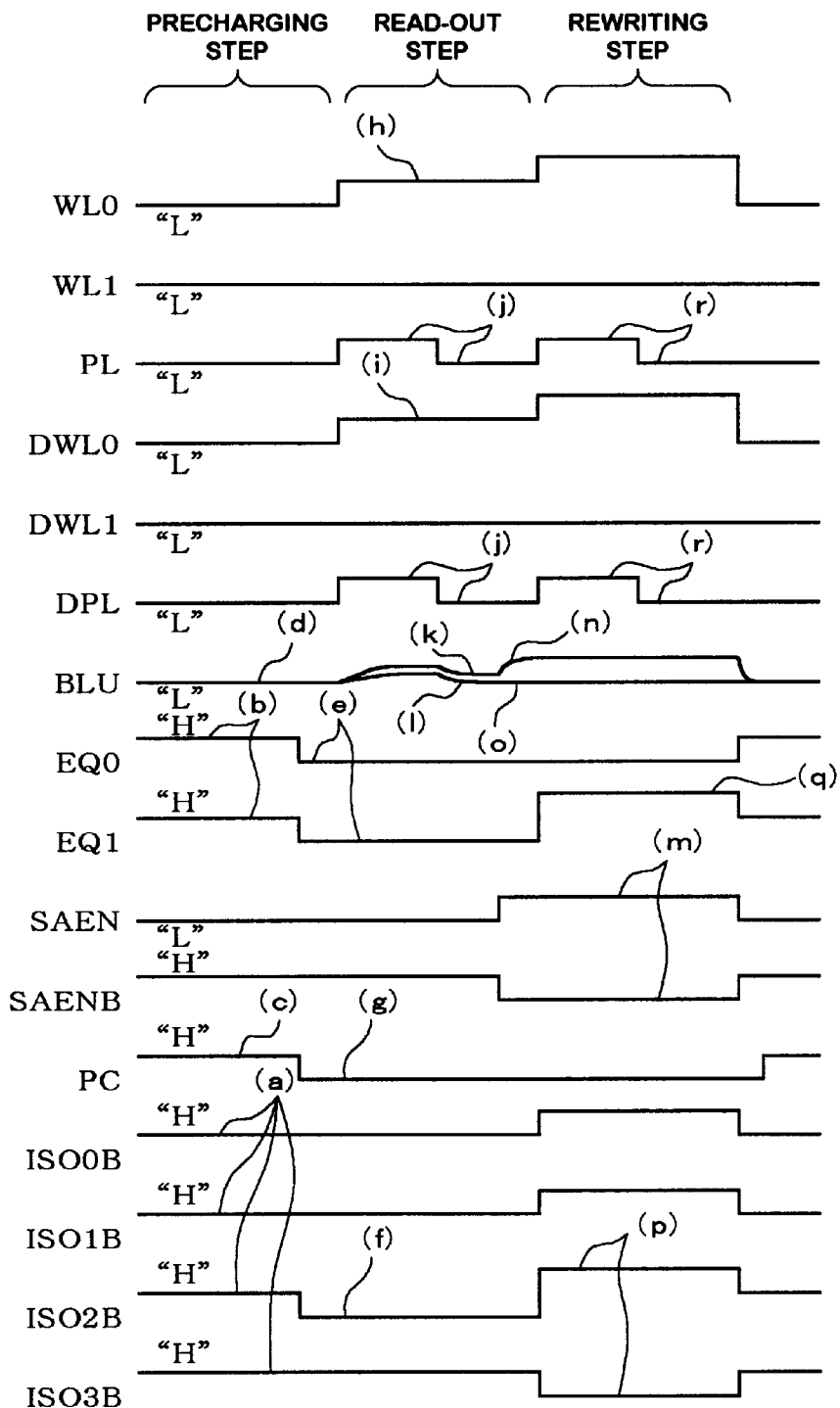
FIG. 2 is a timing chart showing conditions of lines for reading-out the data stored in a memory cell MC00.

FIG. 2 is a timing chart showing conditions of lines to read out the data stored in the memory cell MC00. FIG. 4 through FIG. 8 are circuit diagrams which are used to describe operations to read out the data. A series of operations (one operating cycle) to read out the data stored in the memory cell MC00 will be described in accordance with FIG. 4 through FIG. 8 with reference to FIG. 2 and FIG. 3.

Figure 4:
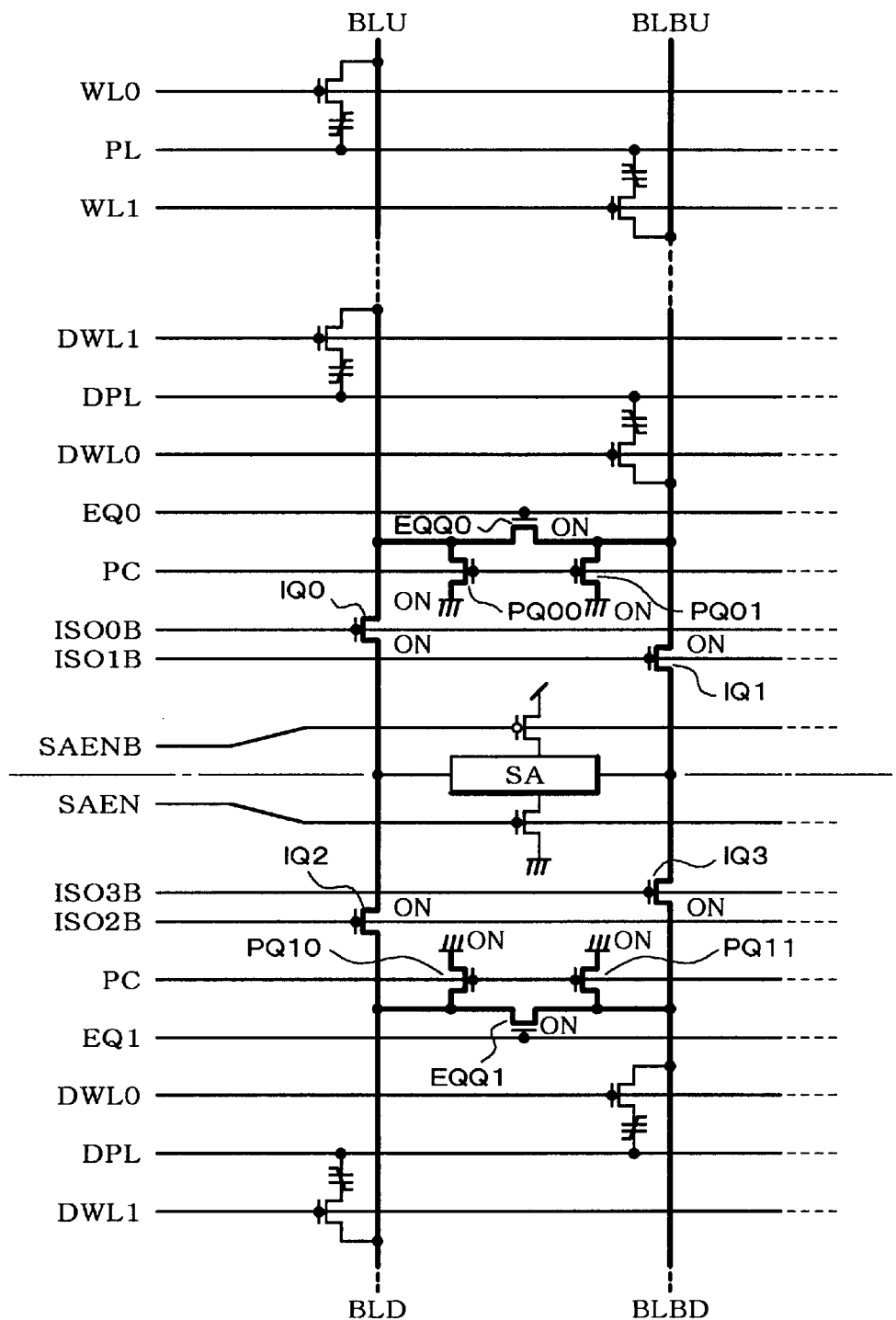
FIG. 4 is a diagram which is used to describe operation for reading-out the data.

All transistors IQ0, IQ1, IQ2, and IQ3 are turned into an ON state by applying voltages representing "HIGH" state to lines IS00B, IS01B, IS02B and IS03B as shown in FIG. 4. At the same time, transistors EQQ0, EQQ1 are turned into an ON state by applying voltages representing a "HIGH" state to lines EQ0, EQ1 (see FIG. 2, (b)), while turning transistors PQ00, PQ01, PQ10, and PQ11 into ON state by applying a voltage representing "HIGH" state to a line PC (see FIG. 2, (c)). Hence, a pair of the upper bit lines BLU, BLBU, and a pair of the lower bit lines BLD, BLBD are connected with one another, and all of those lines are grounded. In this way, electric potential of all the bit lines are to be equivalent to one another (the ground voltage), and parasitic capacitances Cb owned by each of the bit lines are precharged to the ground voltage (see FIG. 2, (d)).

Figure 5:
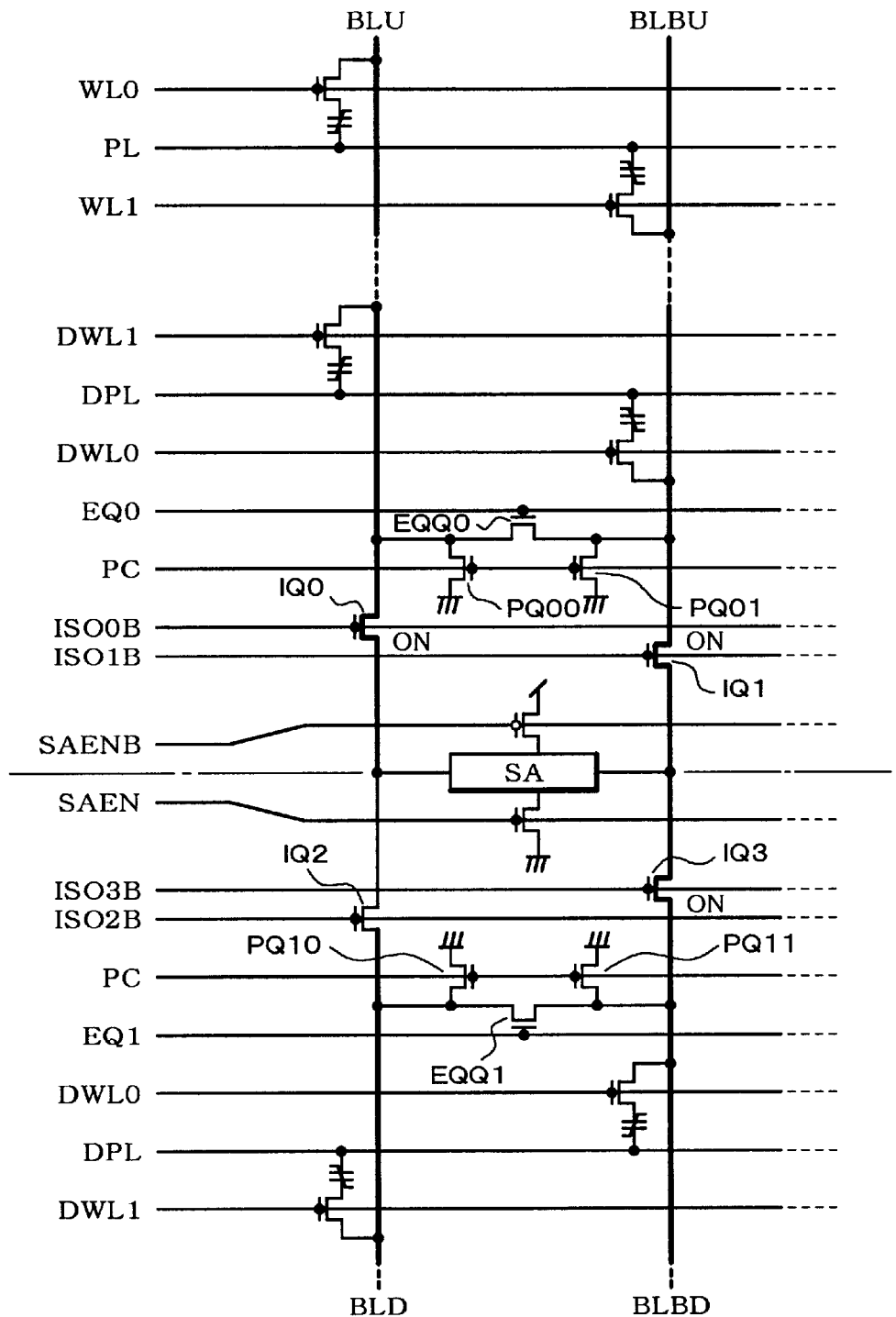
FIG. 5 is a diagram which is used to describe operation for reading-out the data.

On completion of the precharging, the transistors EQQ0, EQQ1 are turned into OFF state by applying voltages representing "LOW" state to lines EQ0, EQ1 as shown in FIG. 5 (see FIG. 2, (e)). Hence, the upper bit lines BLU, BLBU are disconnected with each other, and the lower bit lines BLD, BLBD are isolated with each other.

Further, only the transistor IQ2 among the transistors IQ0, IQ1, IQ2, and IQ3 is turned into OFF state by applying a voltage representing "LOW" state only to the line IS02B among the lines IS00B, IS01B, IS02B and IS03B (see FIG. 2, (f)).

In this way, the upper bit lines BLU and the lower bit line BLD are disconnected from each other, and the upper bit line BLBU and the lower bit line BLBD are connected with each other.

At that time, the transistors PQ00, PQ01, PQ10, and PQ11 are turned into OFF state by applying a voltage representing "LOW" state to the line PC (see FIG. 2, (g)). Hence, each of the bit lines is made under a floating state. The operation described hitherto is referred to as the "precharging step" (see FIG. 2).

Figure 6:
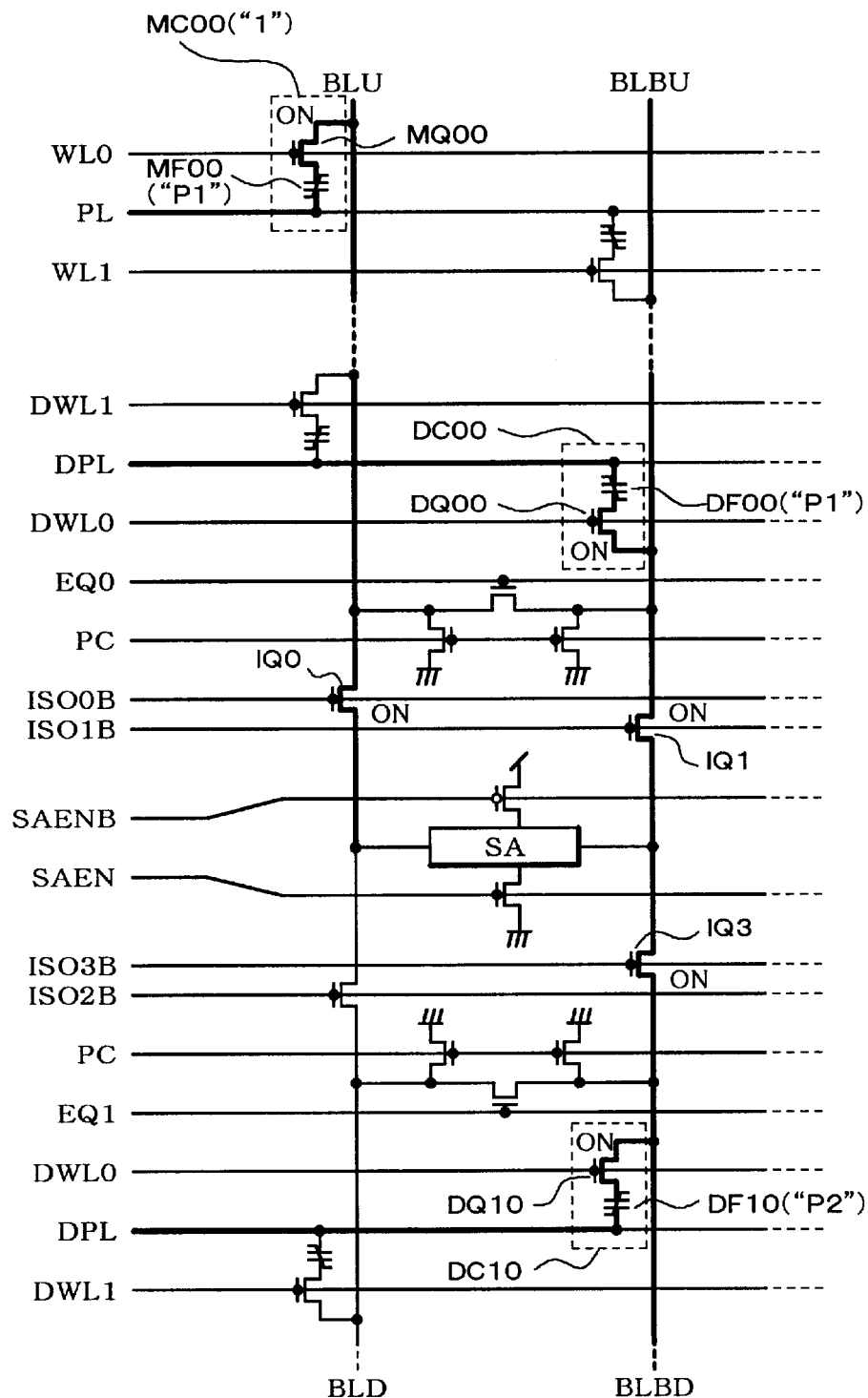
FIG. 6 is a diagram which is used to describe operation for reading-out the data.

Next, the transistor MQ00 is turned into an ON state by applying a voltage representing a "HIGH" state to the word line WL0 as shown In FIG. 6 (see FIG. 2, (h)). Hence, the ferroelectric capacitor MF00 is connected to the upper bit line BLU, that is, the memory cell MC00 is selected.

Further, the transistors DQ00 and DQ10 are turned into an ON state by applying a voltage representing a "HIGH" state to a dummy word line DWL0 (see FIG. 2, (i)). Hence, the ferroelectric capacitors DF00 and DF10 are connected respectively to the upper bit line BLBU and the lower bit line BLBD. In other words, the dummy cells DC00 and DC10 are respectively connected to the upper bit line BLBU and the lower bit line BLBD.

At that time, a voltage representing a "HIGH" state is applied to the plate line PL and dummy plate line DPL once, and another voltage representing a "LOW" state is applied to these plate lines (see FIG. 2, (j)). The ferroelectric capacitor MF00 of the memory cell MC00 discharges electric charges corresponding to the data stored therein, that is, corresponding to the polarization state of the ferroelectric capacitor MF00 by applying the voltage representing a "HIGH" state to the plate line PL once, then applying the voltage representing a "LOW" state to the plate line PL.

Here, the description will be made under an assumption that a value of the stored data in the memory cell MC00 is "1" (that is, the polarization state of the memory cell MC00 is in the point P1 shown in FIG. 3). In this case, electric charges shown in an equation ΔQ1=2Qr (Qr represents the value of remanent polarization of the ferroelectric capacitor MF00) are discharged on the upper bit line BLU as shown in FIG. 3. This is because the polarization state of the ferroelectric capacitor MF00 is moved to the point P2 from the point P1 through a point P3 during the readout operation.

It is, therefore, an electric potential Vi (data corresponding value) of the upper bit line BLU can be defined by the following equation:

$$V1=\Delta Q1/(Cb+Cc)$$

$$=2Qr/(Cb+Cc)$$

wherein Cb is a parasitic capacitance of the bit line, Cc is a capacitance of the ferroelectric capacitor (see FIG. 2, (k)).

Electric charges shown in an equation ΔQ0=0 are discharged on the upper bit line BLU as shown in FIG. 3 when the stored data of the memory cell MC00 is in "0". This is because the polarization state of the ferroelectric capacitor MF00 circulates the hysteresis loop from the point P2 thereto through the point P3.

It is, therefore, an electric potential V0 (data corresponding value) of the upper bit line BLU can be defined by the following equation when the stored date of the memory cell MC00 is in "0":

$$V0=\Delta Q0/(Cb+Cc)$$

$$=0 \text{ (see FIG. 2, (l))}.$$

On the other hand, electric charges corresponding to each of the polarization states of the ferroelectric capacitor DF00 in the dummy cell DC00 and that of the ferroelectric capacitor DF10 in the dummy cell DC10 are discharged respectively by applying a voltage representing a "HIGH" state to the dummy plate line DPL once, and applying another voltage representing "LOW" state thereto.

As described earlier, the dummy cells DC00, DC10 are designed so as to maintain the opposite polarization state P1, P2 from each other out of two polarization states (see FIG. 3). Here, it is defined that the polarization states of the ferroelectric capacitor DF00 in the dummy cell DC00 and that of the ferroelectric capacitor DF10 in the dummy cell DC10 are shown as the point P1 and the point P2 respectively (see FIG. 3).

Under the circumstances, electric charges shown in an equation AQD1=2Qr are discharged by the ferroelectric capacitors DF00 to the upper bit line BLBU, and electric charges shown in an equation AQD0=0 are discharged by the ferroelectric capacitors DF10 to the lower bit line BLBD.

It is, therefore, an electric potential Vref (which corresponds to the reference value) of the upper bit line BLBU and that of the lower bit line BLBD, both the bit lines connected with each other, can be defined by the following equation:

$$Vref(\Delta QD1+\Delta QD0)/(2(Cb+Cc))$$

$$=Qr(Cb+Cc)$$

$$=V1/2.$$

In other words, the electric potential Vref may be considered as an average value of the electric potentials Vref1 and Vref2 appearing respectively on the upper bit line BLBU and the lower bit line BLBD, the potential Vref1 is defined by the following equation:

$$Vref1=\Delta QD1/(Cb+Cc)$$

$$=2Qr/(Cb+Cc)$$

$$=V1,$$

and the potential Vref2 is defined by the following equation:

$$Vref2=\Delta QD0/(Cb+Cc)$$

$$=0.$$

The potentials Vref1 and Vref2 correspond respectively to a first reference value and a second value.

Figure 7:
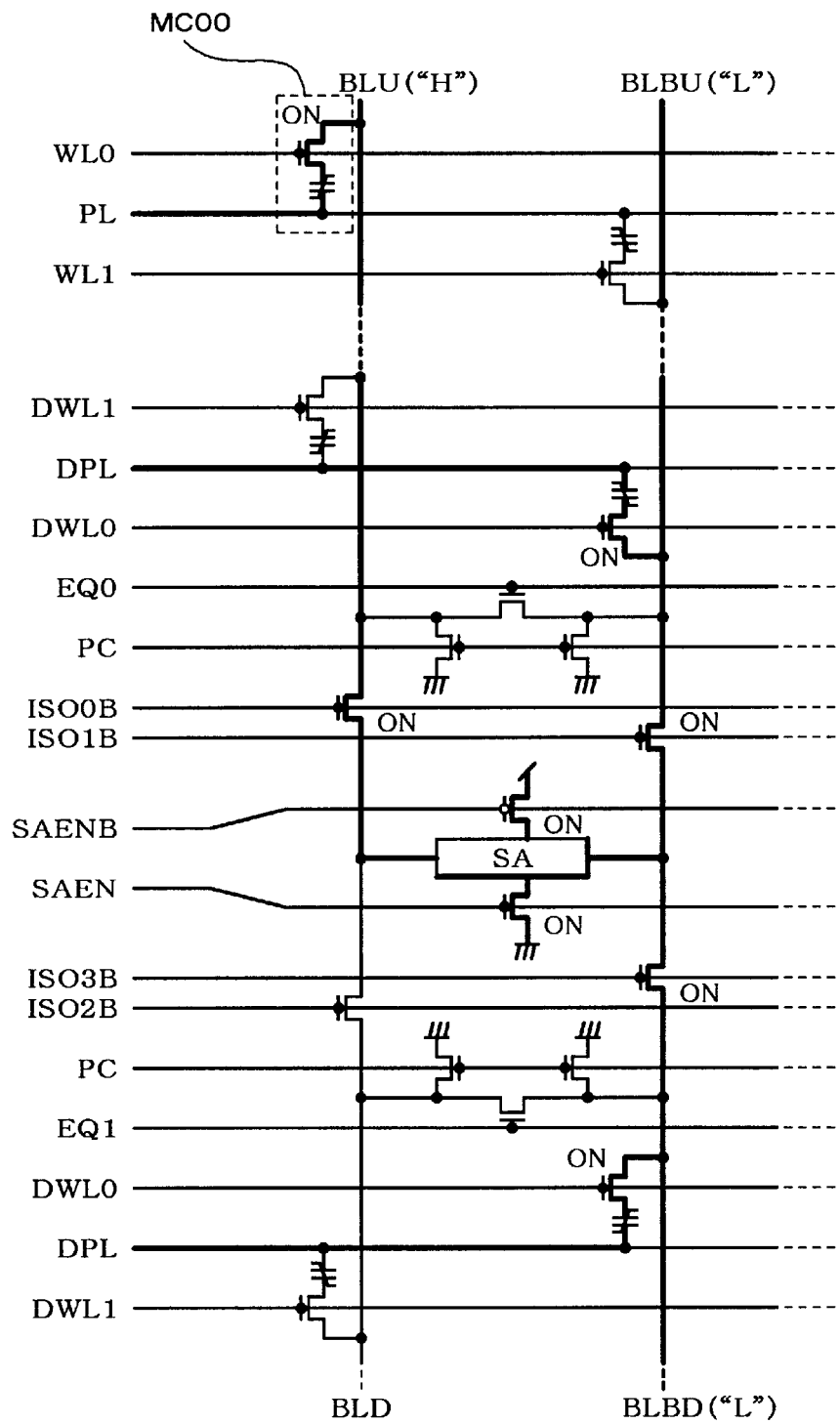
FIG. 7 is a diagram which is used to describe operation for reading-out the data.

Next, as shown in FIG. 7, the sensing amplifier SA is turned into an ON state by applying a voltage representing a "HIGH" state to a line SAEN and a voltage representing a "LOW" state to a line SAENB (see FIG. 2 (m)).

The sensing amplifier SA compares the electric potential appearing on the upper bit line BLU with the electric potentials appearing on the upper bit line BLBU and the lower bit line BLBD, both the bit lines connected with each other. That is, the sensing amplifier SA compares the electric potential appearing on the upper bit line BLU with the reference value Vref. As a result of the comparison, a voltage representing a "HIGH" state is applied compulsory to the bit line having a higher potential than that of other bit line(s), and a voltage representing a "LOW" state is applied compulsory to the bit line having a lower potential than that of other bit line(s).

In this example, the electric potential of the upper bit line BLU is in V1 which is greater than the reference value Vref (=V1/2) because the data stored in the memory cell MC00 is in "1". Under the circumstances, the sensing amplifier SA applies a voltage representing a "HIGH" state compulsory to the upper bit line BLU (see FIG. 2, (n)), and applies a voltage representing a "LOW" state compulsory to the upper bit line BLBU and the lower bit line BLBD.

On the contrary, the electric potential of the upper bit line BLU is in "0" which is less than the reference value Vref (=V1/2) when the data stored in the memory cell MC00 is in "0". Under the circumstances, the sensing amplifier SA applies a voltage representing a "LOW" state compulsory to the upper bit line BLU (see FIG. 2, (o)), and applies a voltage representing a "HIGH" state compulsory to the upper bit line BLBU and the lower bit line BLBD.

The electric potential of the upper bit line BLU thus obtained, representing either a "HIGH" state or a "LOW" state, is outputted to the outside of the device through input/output lines (not shown). The operation described hitherto is referred to as the "readout step" (see FIG. 2).

Figure 8:
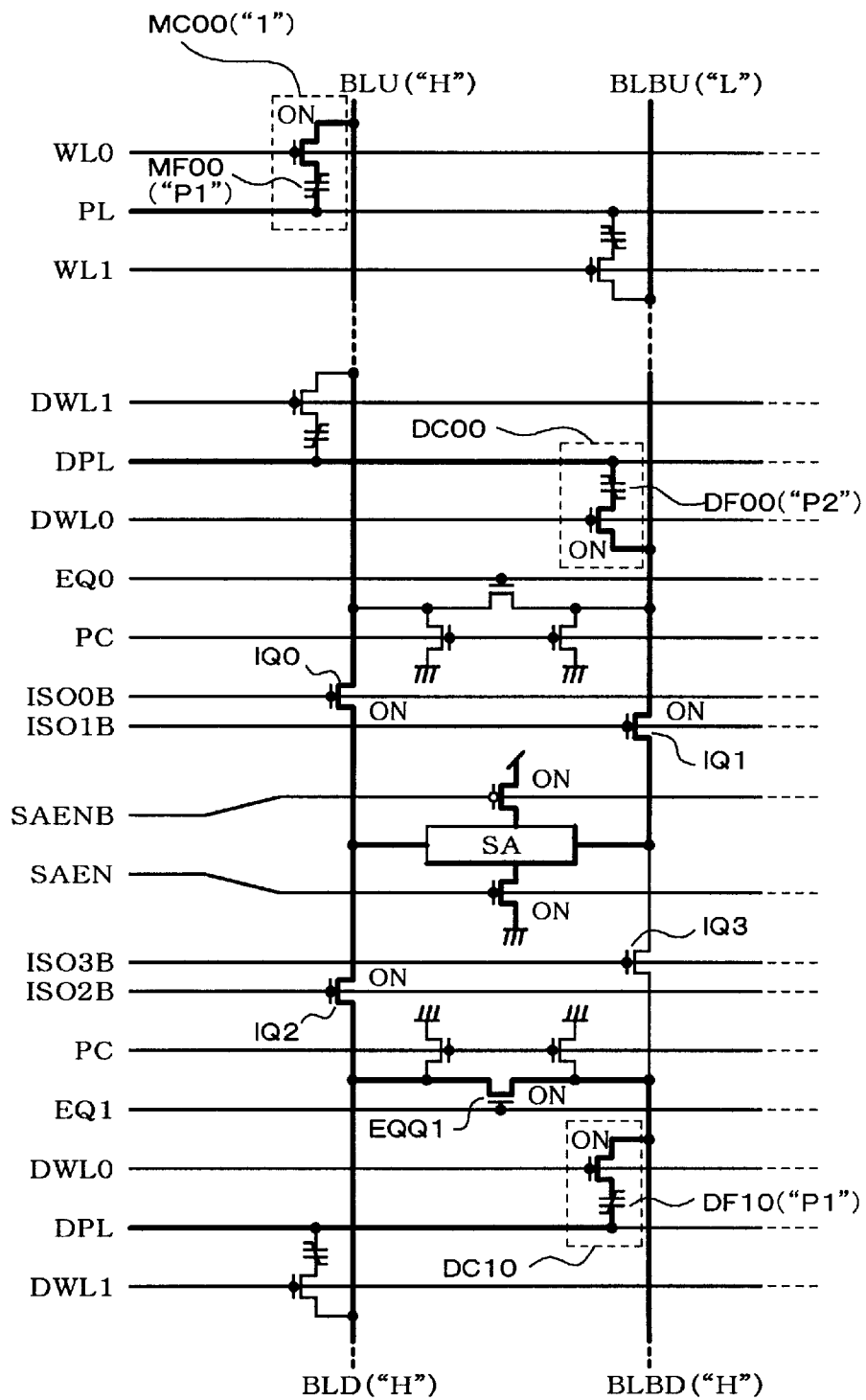
FIG. 8 is a diagram which is used to describe operation for reading-out the data.
Figure 9:
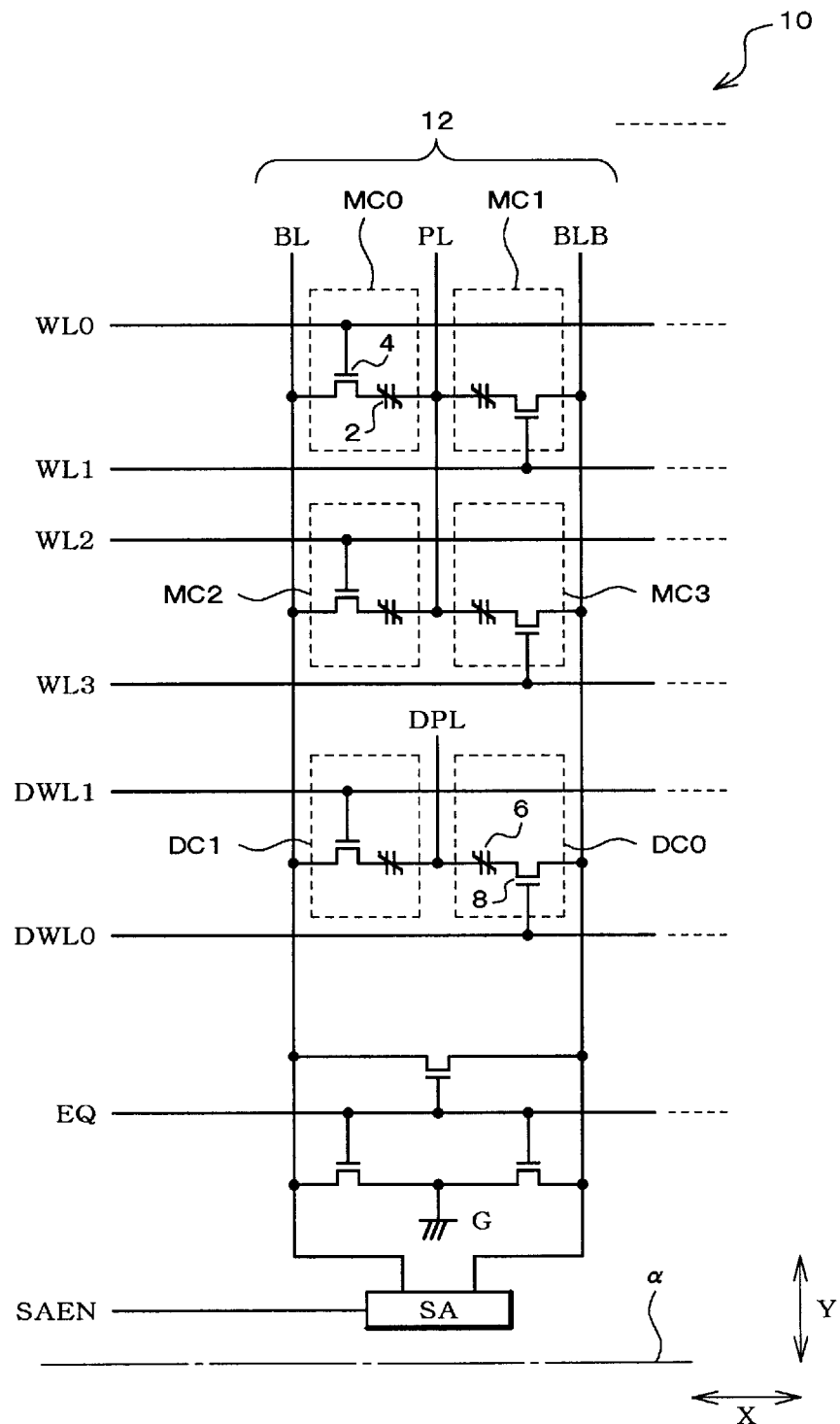
FIG. 9 is a diagram showing a part of the circuit structure of the conventional ferroelectric memory.
Figure 10A:
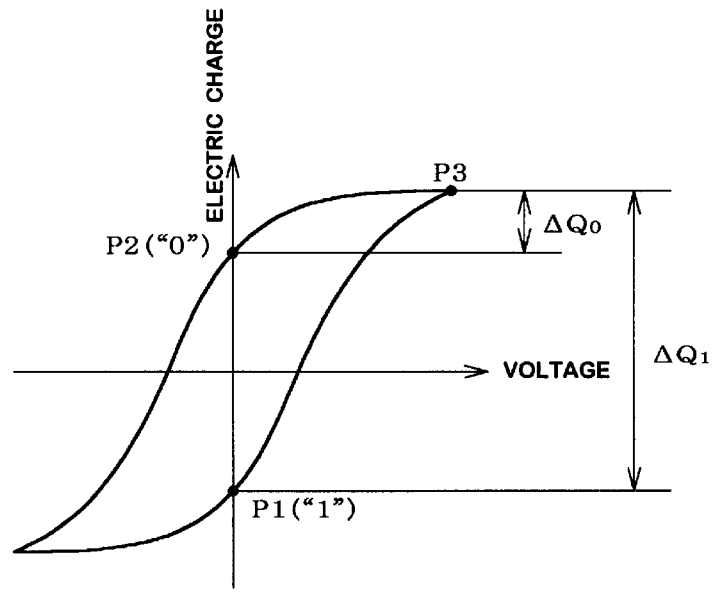
FIG. 10A is a graph showing voltage/charge characteristics of a ferroelectric capacitor used for a memory cell in the conventional ferroelectric memory.
Figure 10B:
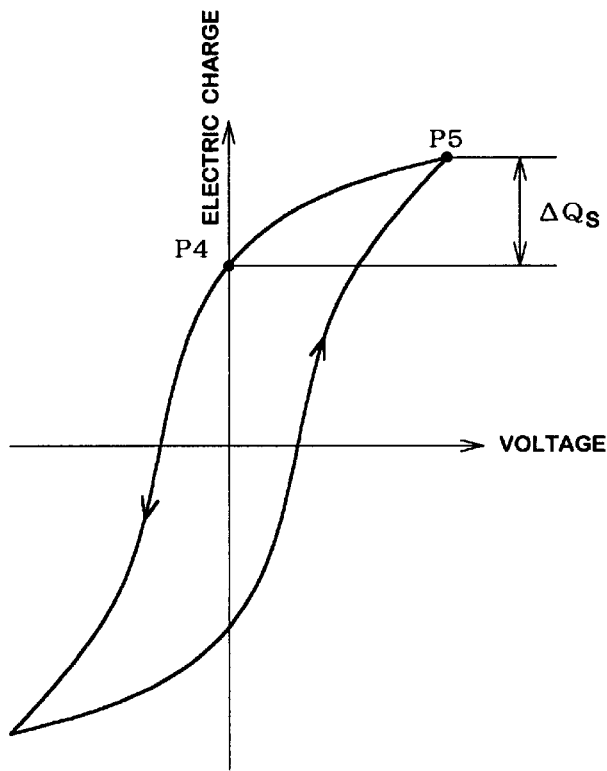
FIG. 10B is a graph showing voltage/charge characteristics of a ferroelectric capacitor used for a dummy cell in the conventional ferroelectric memory.

Next, as shown in FIG. 8, a voltage representing a "HIGH" state is applied to the plate line PL and the dummy plate lines DPL once, then a voltage representing a "LOW" state is applied to the plate lines (see FIG. 2, (r)). As described earlier, the electric potential of the upper bit line BLU is maintained in a "HIGH" state. In this connection, the polarization state of the ferroelectric capacitor MF00 in the memory cell MC00 returns to the polarization state before carrying out the readout operation by applying the voltage representing a "HIGH" state to the plate lines once, then applying the voltage representing a "LOW" state to the plate lines. In this case, the polarization state of the ferroelectric capacitor MF00 returns to the point P1 shown in FIG. 3. In other words, data "1" is written again into the memory cell MC00.

On the other hand, the polarization states of the ferroelectric capacitors DF00 and DF10 are in the predetermined states when a voltage representing a "HIGH" state is applied to the dummy plate lines DPL once, then applying a voltage representing a "LOW" state to these dummy plate lines. As to the polarization states of the ferroelectric capacitors DF00 and DF10 will be described below. The procures for rewriting the data into the memory cell MC00 and related procedures thereto are hereinafter referred to as the rewriting operation. The transistor IQ2 is turned into an ON state by applying a voltage representing a "HIGH" state to the line IS02B, and the transistor IQ3 is turned into an OFF state by applying a voltage representing a "LOW" state to the line IS03B (see FIG. 2, (p) during the rewriting operation. The remaining transistors IQ0, IQ1 maintain their ON state.

Further, the transistor EQQ1 is turned into an ON state by applying a voltage representing a "HIGH" state to the line EQ1 (see FIG. 2, (q)).

Hence, the upper bit line BLU, the lower bit lines BLD and BLBD are connected with one another, and the upper bit line BLBU and the lower bit line BLBD are isolated from with each other. Under the circumstances, though the upper bit line BLBU maintains its potential as a "LOW" state, the electric potential of the lower bit line BLBD which is connected to the upper bit line BLU having a "HIGH" state is turned into a "HIGH" state.

In this way, the polarization state of the ferroelectric capacitor DF00 in the dummy cell MC00 which is connected to the upper bit line BLBU is moved to the point P2, and the polarization state of the ferroelectric capacitor DF10 in the dummy cell MC10 which is connected to the lower bit line BLBD is moved to the point P1 by carrying out the rewriting operation described earlier (see FIG. 3).

In other words, the polarization state of the ferroelectric capacitor DF00 is turned into the opposite polarity to that of the ferroelectric capacitor MF00 in the memory cell MC00, the polarization state of the ferroelectric capacitor DF10 is identical with that of the ferroelectric capacitor MF00 in the memory cell MC00 by carrying out the rewriting operation.

In this embodiment, the polarization states of the ferroelectric capacitors DF00 and DF10 are turned respectively into the opposite polarities from that of these capacitors before carrying out the readout operation (see FIG. 6) when the data having the opposite value from the data being read out previously is read out on the same bit line.

The polarization state in each of the ferroelectric capacitors composing the pair of dummy cells is turned over whenever the data having the opposite value is read out because the polarization state of the ferroelectric capacitors in the dummy cells is determined in accordance with the content of the data stored in the selected memory cell. As a result, there might be a slight probability of causing phenomena called "imprinting" in the ferroelectric capacitors composing the dummy cells.

In this embodiment, voltages having higher values than that of the voltages representing the "HIGH" state (boosted voltages) are applied to the word line WL0, the dummy word line DWL0, the line EQ1, the lines IS00B, IS01B, and IS02B during the rewriting operation as shown in FIG. 2. This is to apply sufficient voltages for rewriting the data to each of the ferroelectric capacitances by compensating voltage drops caused by the threshold voltages of the transistors connected to the lines stated above. The operation described hitherto is referred to as a "rewriting step" (see FIG. 2).

In order to complete one operating cycle for reading out the data, the voltages being applied during the precharging step need to be applied to all of the lines as shown in FIG. 2.

Transistors are used for connecting each of the ferroelectric capacitors with the bit lines in the embodiments described above, switching elements other than transistors can be used to connect the ferroelectric capacitors with the bit lines.

Although all the ferroelectric capacitors are designed so as to have the same voltage/charge characteristics in the embodiments described above, the present invention is not limited to the design. For instance, the voltage/charge characteristics of the capacitors used for storing the data, and that of the capacitors used as the reference element can differ from each other.

Further, all the capacitors are composed of a plurality of ferroelectric capacitors in the embodiments described above, the present invention is not limited to the composition. Still another composition, such as using ferroelectric capacitors as the memory elements, and using permanent capacitors as the reference element can be employed. Still other compositions, such as using permanent capacitors as the memory elements, and using ferroelectric capacitors as the reference element may also be employed. In addition, all the capacitors can be composed of a plurality of permanent capacitors.

Although all the memory elements and the reference elements include capacitors in the embodiments described above, the present invention is not limited to the structure. The present invention is applicable to a data storing device including electric elements other than capacitors such as ferroelectric transistors as a part or all of the memory elements and the reference elements.

Although the data storing device having two of the element blocks (the element blocks CB0 and CB1 in the embodiment) is described in the embodiments described above, the present invention is not limited to that number of element blocks. The present invention is applicable to a data storing device including three or more element blocks. At least two of the element blocks need to have the structure described earlier when the data storing device includes three or more element blocks.

The present invention is characterized in that, the judging part judges contents of data stored in a selected memory element by comparing a data corresponding value corresponding to the data stored in the selected memory element which is one of the memory elements belonging to the first element block and the memory element belonging to the second element block with the reference value.

Therefore, the judging part is used commonly for two element blocks. This contributes to the compactness of the device because there is no need for providing dedicated judging parts to each of the element blocks.

Also, the reference value generating part includes a first reference element belonging to the first element block and a second reference element belonging to the second element block, and wherein the reference value generating part generates the reference value by synthesizing a first reference value established by the first reference element and a second reference value generated by the second reference element.

In this way, the reference value generating part is commonly used by the two element blocks. This also contributes to the compactness of the device because there is no need for providing a dedicated reference value generating part to each of the element blocks. In other words, it is possible to provide a data storing device capable of increasing the capacity of the storage while restricting undesirable growth in size of the device.

Further, the present invention is characterized in that each of the memory elements, the first reference element, and the second reference element includes a capacitor having substantially the same voltage/charge characteristics.

It is, therefore, the memory element and the reference element can be fabricated in the same size. As a result, not much dead space is produced during the layout of the cells. In other words, undesirable growth in the size of the device may further be restricted.

Still further, the present invention is characterized in that each of the capacitors is a ferroelectric capacitor, and each of the memory elements stores one of the data out of two kinds of data which corresponds to the two kinds of polarization states of the ferroelectric capacitor.

Therefore, an nonvolatile type data storing device may easily be realized by constructing the memory elements using ferroelectric capacitors.

The present invention is characterized in that each of the first reference element and the second reference element respectively stores a polarization state different from the other out of the two kinds of the polarization states.

In this way, the reference value may easily and accurately be generated by averaging the first reference value established by the first reference element and the second reference value generated by the second reference element.

The two polarization states capable of being stored in each of the reference elements and that capable of being stored in each of the memory elements are identical to each other. In this way, peripheral circuits and procures for storing data into the memory elements can also be used for polarizing each of the reference elements as they are. Consequently, undesirable growth in the size of the device may further be restricted, as well as reducing access time to the memory elements.

Further, the present invention is characterized in that, the polarization states, both different from each other which is to be stored in the first reference element and the second reference element are determined so as to correspond with the contents of the data stored in the selected memory element.

Therefore, the polarization state stored in each of the ferroelectric capacitors composing the pair of dummy cells is turned over whenever the data having the opposite value is read out and being stored. As a result, there might be only a slight probability of causing the undesirable phenomena called "imprinting" in the reference elements. Consequently, it is possible to generate the reference value accurately for a long period of time.

Still further, the present invention is characterized in that the data storing device comprises two element blocks, each of which includes a pair of data lines isolated from each other, one or more memory elements, one of which capable of being selectively connected to one data line, and reference element connected to the other data line.

The number of the memory cells can be increased without changing the length of the data lines by providing the two element blocks including a pair of the data lines isolated from each other. In this way, the capacity of the storage may be increased while restricting the decrease of access speed.

The present invention is characterized in that one detection terminal of the sensing amplifier is connected with the one data line belonging to one of the element blocks including the selected memory element.

The sensing amplifier is used commonly for two element blocks. This contributes to the compactness of the device because there is no need for providing dedicated sensing amplifiers to each of the element blocks.

Further, the present invention is characterized in that the sensing amplifier judges contents of data stored in a selected memory element using a reference value generated with the pair of reference elements by connecting one detection terminal of the sensing amplifier with the one data line belonging to one of the element blocks including the selected memory element while connecting the other detection terminal of the sensing amplifier with the other data line, both of the data lines belonging respectively to the element blocks.

The pair of reference elements are used commonly for two element blocks. This contributes the compactness of the device because there is no need for providing dedicated reference elements to each of the element blocks.

In this way, the capacity of the storage may be increased while restricting the decrease of access speed as well as restricting undesirable growth in size of the device.

Further, the present invention is characterized in that each of the memory elements belonging to the element blocks respectively includes a capacitor connected to the one data line of its element block through a transistor, and each of the reference elements belonging to the element blocks respectively includes a capacitor connected to the other data line of its element block through a transistor, and each of the capacitors has substantially the same voltage/charge characteristics.

Therefore, the memory element and the reference element can be fabricated as an element including a capacitor and a transistor, both manufactured in the same size. As a result, not much dead space is produced during the layout of the cells. In other words, undesirable growth in the size of the device may further be restricted.

Still further, the present invention is characterized in that each of the capacitors is a ferroelectric capacitor, and each of the memory elements stores one of the data out of two kinds of data which corresponds to two kinds of polarization states of the ferroelectric capacitor.

In this way, an nonvolatile type data storing device so called one transistor and one capacitor type may easily be realized by constructing the memory elements.

The present invention is characterized in that each of the two reference elements stores a polarization state different from each other out of the two kinds of the polarization states.

In this way, the reference value may easily be generated by averaging the reference values respectively established by the two reference elements.

In addition, the two polarization states capable of being stored in each of the reference elements and that capable of being stored in each of the memory elements are identical with each other. In this way, peripheral circuits and procures for storing data into the memory elements can also be used for polarizing each of the reference elements as they are. Consequently, undesirable growth in the size of the device may further be restricted as well as reducing a series of time required to access for carrying out data renewal.

Further, the present invention is characterized in that a polarization state of the reference element belonging to the element block not including the selected memory element is made the same as that of the selected memory element as a result of connecting the one detection terminal of the sensing amplifier with the one data line belonging to the element block including the selected memory element and the other data line belonging to the element block not including the selected memory element.

In this way, the polarization state of the reference element belonging to an element block not including a selected memory element may be made the same as the polarization state of the selected memory element simultaneously with when data is stored in the selected memory element.

Still further, a polarization state of the reference element belonging to the element block including the selected memory element is made different from that of the selected memory element as a result of connecting the other detection terminal of the sensing amplifier with the other data line belonging to the element block including the selected memory element.

In this way, the polarization state of the reference element belonging to the element block including the selected memory element may be made different from the polarization state of the selected memory element simultaneously with when data is stored in the selected memory element.

Consequently, the polarization states of the pair of reference elements can be made different from each other simultaneously with when data is stored in the selected memory element. In other words, a series of time required to access for carrying out data renewal can be decreased.

In addition, the polarization states stored in the pair of reference elements is turned over whenever the data having the opposite value is read out and being stored. As a result, there might be only a slight probability of causing undesirable phenomena called "imprinting" in the reference elements. Consequently, it is possible to generate the reference value accurately for a long period of time.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A data storing device comprising:
    memory elements for storing data,
    a reference value generating part for generating a reference value, and
    a judging part for judging contents of the data stored in the memory elements by comparing a data corresponding value corresponding to the data stored in the memory element with the reference value generated by the reference value generating part,
    wherein the data storing device includes a first element block having one or more of the memory elements and a second element block having one or more of the memory elements not belonging to the first element block,
    and wherein the reference value generating part includes a first reference element belonging to the first element block and a second reference element belonging to the second element block, and wherein the reference value generating part generates the reference value by synthesizing a first reference value established by the first reference element and a second reference value generated by the second reference element,
    and wherein the judging part judges contents of data stored in a selected memory element by comparing a data corresponding value corresponding to the data stored in the selected memory element which is one of the memory elements belonging to the first element block and the memory element belonging to the second element block with the reference value.

2. The data storing device in accordance with claim 1, wherein each of the memory elements, the first reference element, and the second reference element includes a capacitor.

3. The data storing device in accordance with claim 2, wherein each of the capacitors is a ferroelectric capacitor,
    and wherein each of the memory elements stores one of the data out of two kinds of data which corresponds to two kinds of polarization states of the ferroelectric capacitor,
    and wherein each of the first reference element and the second reference element respectively stores a polarization state different from the other out of the two kinds of the polarization states.

4. The data storing device in accordance with claim 3, wherein the polarization states, both different from each other, which are to be stored in the first reference element and the second reference element are determined so as to correspond with the contents of the data stored in the selected memory element.

5. The data storing device in accordance with claim 4, wherein the polarization state of the first reference element is made different from that of the selected memory element while making the polarization state of the second reference element the same as that of the selected memory element when the selected memory element belongs to the first element block,
    and wherein the polarization state of the second reference element is made different from that of the selected memory element while making the polarization state of the first reference element the same as that of the selected memory element when the selected memory element belongs to the second element block.

6. The data storing device in accordance with claim 1, wherein the reference value generating part obtains the reference value by averaging the first reference value established by the first reference element and the second reference value generated by the second reference element.

7. The data storing device in accordance with claim 1, wherein a plurality of memory cells is arranged in a matrix format by disposing a plurality of column elements, each of which include the first element block, the second element block, and the judging part.

8. A data storing device comprising:
    two element blocks, each of which includes a pair of data lines isolated from each other, one or more memory elements, one of which is capable of being selectively connected to one data line, and a reference element connected to the other data line, and
    a sensing amplifier having a pair of detection terminals for receiving signals having incoming values, the sensing amplifier judging which one of the incoming values being inputted to the detection terminals is greater, and a pair of signals having output values different from each other being outputted from the detection terminals by the sensing amplifier in accordance with the judgment made thereby, wherein the sensing amplifier judges contents of data stored in a selected memory element using a reference value generated with the pair of reference elements by connecting one detection terminal of the sensing amplifier with the one data line belonging to one of the element blocks including the selected memory element while connecting the other detection terminal of the sensing amplifier with the other data line, both the data lines belonging respectively to the element blocks.

9. The data storing device in accordance with claim 8, wherein each of the memory elements belonging to the element blocks respectively includes a capacitor connected to the one data line of its element block through a transistor, and wherein each of the reference elements belonging to the element blocks respectively includes a capacitor connected to the other data line of its element block through a transistor.

10. The data storing device in accordance with claim 9, wherein each of the capacitors is a ferroelectric capacitor, and wherein each of the memory elements stores one of the data out of two kinds of data which corresponds to two kinds of polarization states of the ferroelectric capacitor, and wherein each of the two reference elements stores a polarization state different from each other out of the two kinds of the polarization states.

11. The data storing device in accordance with claim 10, wherein a polarization state of the reference element belonging to the element block not including the selected memory element is made the same as that of the selected memory element as a result of connecting the one detection terminal of the sensing amplifier with the one data line belonging to the element block including the selected memory element and the other data line belonging to the element block not including the selected memory element, and wherein a polarization state of the reference element belonging to the element block including the selected memory element is made different from that of the selected memory element as a result of connecting the other detection terminal of the sensing amplifier with the other data line belonging to the element block including the selected memory element.

12. The data storing device in accordance with claim 9, wherein the reference value generated by the pair of the reference elements is equal to an averaged value of voltages appearing on the data lines when each of the reference elements is independently connected to each of the data lines.

13. The data storing device in accordance with claim 8, wherein a plurality of memory cells is arranged in a matrix format by disposing a plurality of column elements, each of which includes the pair of element blocks and the sensing amplifier.

* * * * *

UNITED STATES PATENT AND TRADEMARK OFFICE
CERTIFICATE OF CORRECTION

PATENT NO. : 6,078,529　　　　　　　　　　　　　　　　　　　　Page 1 of 2
DATED : June 20, 2000
INVENTOR(S) : Tada It is certified that error appears in the above-identified patent and that said Letters Patent is hereby corrected as shown below:

Column 1,
Line 36, insert -- . -- after the letters "MC0"
Line 51, "depicts" should read -- depict --
Line 53, delete "12" after the word "element)"

Column 3,
Line 1, "element" should read -- elements --
Line 34, "references" should read -- reference --
Line 57, insert -- , -- after the word "thereof"

Column 4,
Line 61, "comprises" should read -- comprise --

Column 6,
Line 17, insert -- a -- after the word "representing"
Line 22, insert -- an -- after the word "into"
Line 23, insert -- a -- after the word "representing"
Line 32, insert -- an -- after the word "into"
Line 33, insert -- a -- after the word "representing"
Line 35, "with" should read -- from --
Line 36, "with" should read -- from --
Line 38, insert -- an -- after the word "into"
Line 39, insert -- a -- after the word "representing"
Line 42, "lines" should read -- line --
Line 47, insert -- an -- after the word "into"
Line 47, insert -- a -- after the word "representing"

Column 7,
Line 19, "Vi" should read -- V1 --
Line 52, insert -- a -- after the word "representing"
Line 62, "AQD1=2Qr" should read -- $\Delta$QD1=2Qr --
Line 64, "AQD0=0" should read -- $\Delta$QD0=0 --

Column 8,
Line 7, "=Qr(Cb+Cc)" should read -- Qr/(Cb=Cc) --

Column 9,
Line 17, delete "with" after the word "from"
Line 22, "procures" should read -- procedures --

UNITED STATES PATENT AND TRADEMARK OFFICE
CERTIFICATE OF CORRECTION

PATENT NO.     : 6,078,529
DATED          : June 20, 2000
INVENTOR(S)    : Tada

It is certified that error appears in the above-identified patent and that said Letters Patent is hereby corrected as shown below:

Column 11,
Line 26, "corresponds" should read -- correspond --
Line 65, insert -- is -- after the word "which"

Column 12,
Line 33, "includes" should read -- include --
Line 36, "includes" should read -- include --

Signed and Sealed this

Eighteenth Day of December, 2001

Attest:

Attesting Officer

JAMES E. ROGAN
Director of the United States Patent and Trademark Office